(12) United States Patent
Mitani et al.

(10) Patent No.: US 11,063,145 B2
(45) Date of Patent: Jul. 13, 2021

(54) SILICON CARBIDE SEMICONDUCTOR DEVICE AND METHOD FOR MANUFACTURING SAME

(71) Applicant: DENSO CORPORATION, Kariya (JP)

(72) Inventors: Shuhei Mitani, Kariya (JP); Aiko Kaji, Kariya (JP); Yasuhiro Ebihara, Kariya (JP); Tatsuji Nagaoka, Toyota (JP); Sachiko Aoi, Nagakute (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/776,821

(22) Filed: Jan. 30, 2020

(65) Prior Publication Data

US 2020/0168732 A1 May 28, 2020

Related U.S. Application Data

(63) Continuation-in-part of application No. PCT/JP2018/032004, filed on Aug. 29, 2018.

(30) Foreign Application Priority Data

Aug. 31, 2017 (JP) .............................. JP2017-166882

(51) Int. Cl.
*H01L 29/78* (2006.01)
*H01L 29/06* (2006.01)
*H01L 29/10* (2006.01)
*H01L 29/16* (2006.01)
*H01L 29/66* (2006.01)

(52) U.S. Cl.
CPC ...... *H01L 29/7813* (2013.01); *H01L 29/0619* (2013.01); *H01L 29/1095* (2013.01); *H01L 29/1608* (2013.01); *H01L 29/66068* (2013.01)

(58) Field of Classification Search
CPC ............ H01L 29/7813; H01L 29/0619; H01L 29/1095; H01L 29/1608; H01L 29/66068
USPC .......................................................... 257/77
See application file for complete search history.

(56) References Cited

U.S. PATENT DOCUMENTS

| 8,193,564 | B2 | 6/2012 | Suzuki et al. | |
|---|---|---|---|---|
| 2009/0311839 | A1* | 12/2009 | Miyahara ............ | H01L 29/0623 438/270 |
| 2011/0254010 | A1* | 10/2011 | Zhang ............... | H01L 29/66068 257/66 |
| 2012/0319136 | A1 | 12/2012 | Noborio et al. | |

(Continued)

FOREIGN PATENT DOCUMENTS

JP 2008-227356 A 9/2008

*Primary Examiner* — Igwe U Anya
(74) *Attorney, Agent, or Firm* — Posz Law Group, PLC

(57) ABSTRACT

A silicon carbide semiconductor device includes: a substrate; a first impurity region on the substrate; a base region on the first impurity region; a second impurity region in the base region; a trench gate structure including a gate insulation film and a gate electrode in a trench; a first electrode connected to the second impurity region and the base region; a second electrode on a rear surface of the substrate; a first current dispersion layer between the first impurity region and the base region; a plurality of first deep layers in the second current dispersion layer; a second current dispersion layer between the first current dispersion layer and the base region; and a second deep layer between the first current dispersion layer and the base region apart from the trench.

10 Claims, 12 Drawing Sheets

(56) References Cited

U.S. PATENT DOCUMENTS

| | | |
|---|---|---|
| 2014/0021484 A1 | 1/2014 | Siemieniec et al. |
| 2015/0115286 A1* | 4/2015 | Takeuchi ............ H01L 21/8213 |
| | | 257/77 |
| 2016/0056306 A1 | 2/2016 | Masuoka et al. |
| 2016/0247910 A1* | 8/2016 | Suzuki ................ H01L 29/0623 |
| 2017/0110534 A1 | 4/2017 | Shiomi |

* cited by examiner

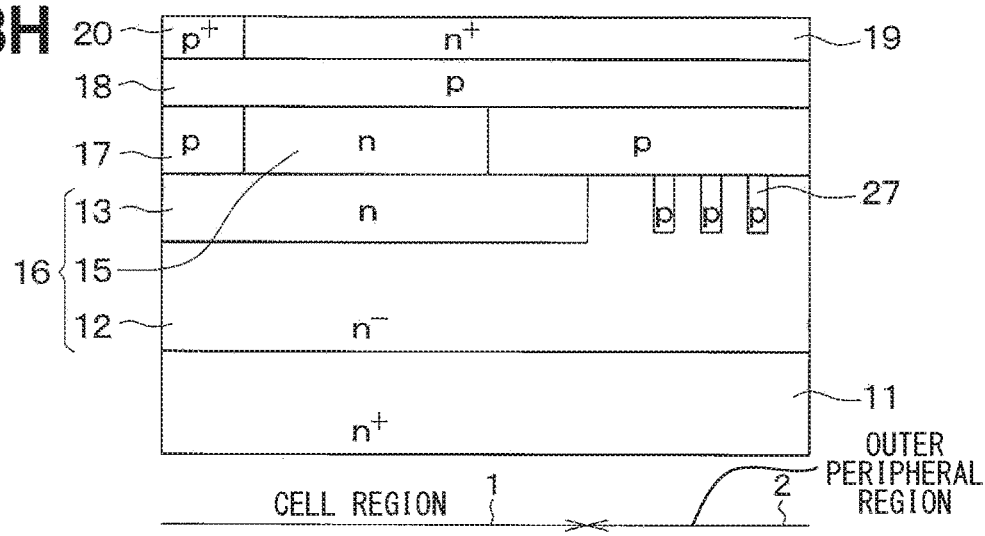
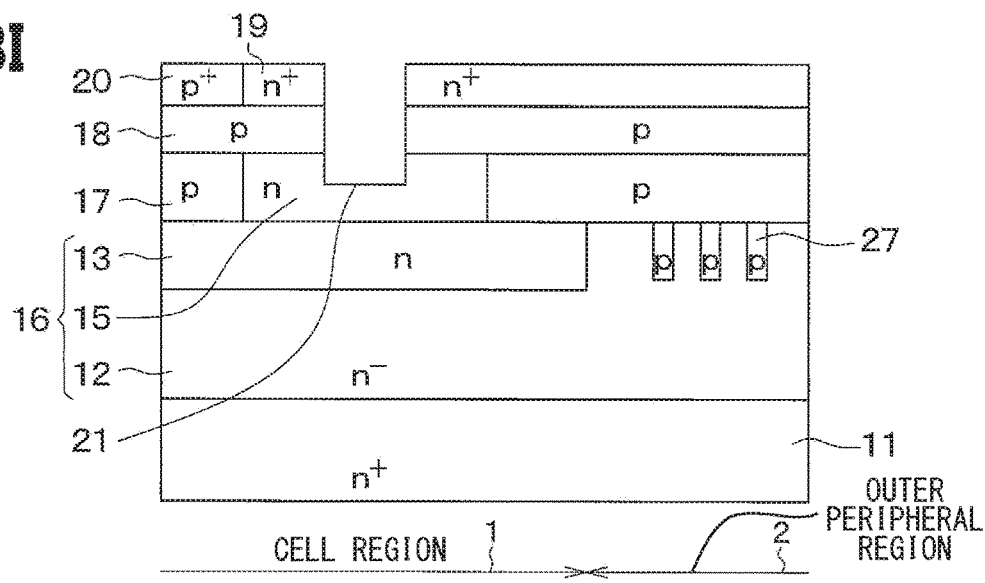
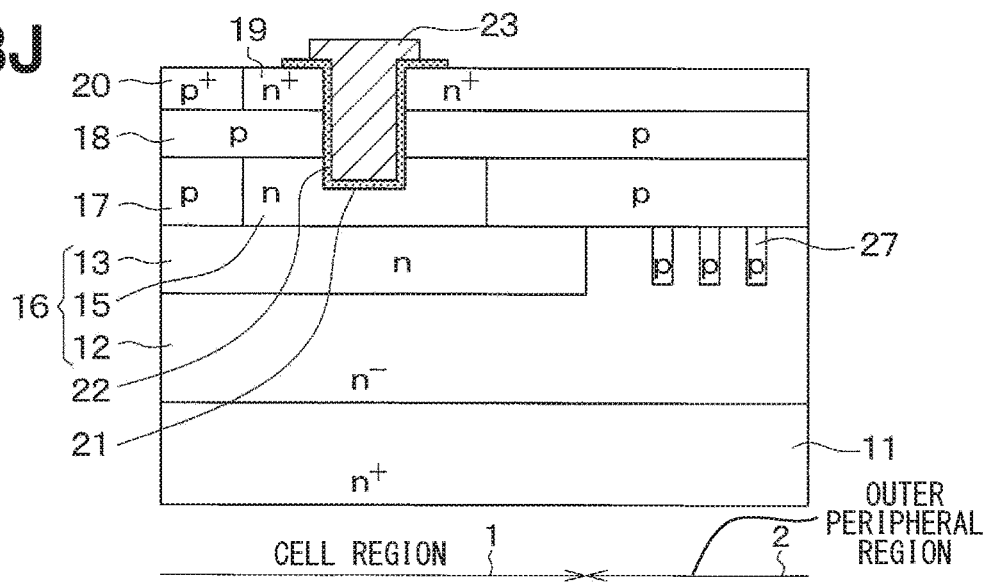

SILICON CARBIDE SEMICONDUCTOR DEVICE AND METHOD FOR MANUFACTURING SAME

CROSS REFERENCE TO RELATED APPLICATION

The present application is a continuation application of International Patent Application No. PCT/JP2018/032004 filed on Aug. 29, 2018, which designated the U.S. and claims the benefit of priority from Japanese Patent Application No. 2017-166882 filed on Aug. 31, 2017. The entire disclosures of all of the above applications are incorporated herein by reference.

TECHNICAL FIELD

The present disclosure relates to a silicon carbide (hereinafter, referred to SiC) semiconductor device having a trench gate structure and a method of manufacturing the semiconductor device.

BACKGROUND

Heretofore, an SiC semiconductor device formed using a substrate made of SiC has been proposed. In other words, in the SiC semiconductor device, an n-type drift layer is formed on a substrate. In addition, a p-type base region is formed in a surface layer portion of the drift layer, and an $n^+$-type source region is formed in a surface layer portion of a base region. A trench that penetrates through the source region and the base region and reaches the drift layer is extended in one direction, and a gate electrode is formed on a wall surface of the trench through a gate insulating film, thereby forming a trench gate structure. Below the base region, multiple p-type deep layers are formed in stripes along a direction intersecting with an extension direction of the trench.

SUMMARY

According to an example, a silicon carbide semiconductor device includes: a substrate; a first impurity region on the substrate; a base region on the first impurity region; a second impurity region in the base region; a trench gate structure including a gate insulation film and a gate electrode in a trench; a first electrode connected to the second impurity region and the base region; a second electrode on a rear surface of the substrate; a first current dispersion layer between the first impurity region and the base region; a plurality of first deep layers in the second current dispersion layer; a second current dispersion layer between the first current dispersion layer and the base region; and a second deep layer between the first current dispersion layer and the base region apart from the trench.

BRIEF DESCRIPTION OF THE DRAWINGS

The objects, features and advantages of the present disclosure will become more apparent from the following detailed description made with reference to the accompanying drawings. In the drawings:

FIG. 8H is a cross-sectional view showing a process of manufacturing the SiC semiconductor device subsequent to FIG. 8G;

FIG. 8I is a cross-sectional view showing a process of manufacturing the SiC semiconductor device subsequent to FIG. 8H;

FIG. 8J is a cross-sectional view showing a process of manufacturing the SiC semiconductor device subsequent to FIG. 8I;

DETAILED DESCRIPTION

Figure 1:
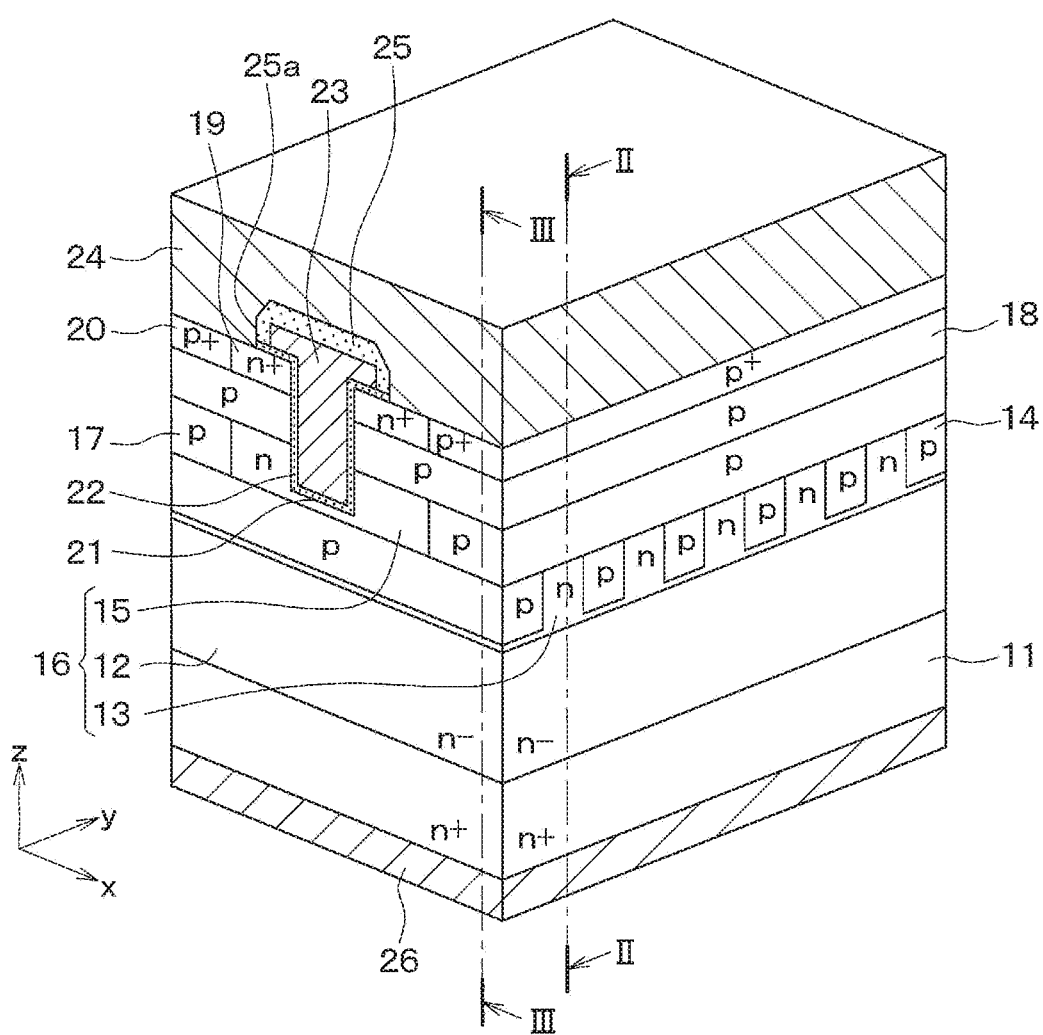
FIG. 1 is a perspective cross-sectional view of an SiC semiconductor device according to a first embodiment.

In a conceivable semiconductor device, it is difficult for a high electric field to enter a gate insulating film side by a depletion layer formed between the deep layers and a drift layer. For that reason, in the SiC semiconductor device described above, breakdown of the gate insulating film can be inhibited.

However, in the SiC semiconductor device described above, although the breakdown of the gate insulating film can be inhibited, a current path tends to be narrowed by a depletion layer formed between the deep layer and the drift layer. For that reason, in the SiC semiconductor device, an on-resistance tends to be high.

An SiC semiconductor device is provided to be capable of reducing an on-resistance while inhibiting destruction of a gate insulating film, and a method for manufacturing the SiC semiconductor device.

According to one aspect of the present embodiments, an SiC semiconductor device having a trench gate structure includes a substrate of a first conductivity type or a second conductivity type which is made of SiC; a first impurity region that is made of SiC of the first conductivity type, formed on a surface of the substrate and having a lower impurity concentration than that of the substrate; a base region that is made of SiC of the second conductivity type and formed on the first impurity region; a second impurity region that is made of SiC of the first conductivity type, formed on a surface layer portion of the base region and has a higher impurity concentration than that of the first impurity region; a trench gate structure that includes a gate insulating film formed on an inner wall surface of a trench provided from a surface of the second impurity region to a depth deeper than the base region and provided in one direction as a longitudinal direction, and a gate electrode formed on the gate insulating film in the trench; a first electrode that is electrically connected to the second impurity region and electrically connected to the base region; and a second electrode that is formed on a rear surface side of the substrate and electrically connected to the substrate. Further, the SiC semiconductor device includes: a first current dispersion layer that is formed between the first impurity region and the base region, and made of SiC of the first conductivity type which is higher in impurity concentration than the first impurity region; a plurality of first deep layers that are made of SiC of the first conductivity type, which are formed in the first current dispersion layer, shallower than the first current dispersion layer and extend in one direction as a longitudinal direction; a second current dispersion layer that is formed between the first current dispersion layer and the base region, at which a bottom of the trench is located, and which is made of SiC of the first conductivity type; and a second deep layer that is made of a SiC of the second conductivity type, which is formed between the first current dispersion layer and the base region, connected to the base region and connected to the first deep layer, and formed apart from the trench.

According to the above configuration, the first current dispersion layer having an impurity concentration higher than that of the first impurity region and the first deep layer formed in the first current dispersion layer are disposed at positions deeper than the trench. For that reason, a high electric field can be inhibited from being applied to the gate insulating film, and the breakdown of the gate insulating film can be inhibited.

The first current dispersion layer has an impurity concentration higher than that of the first impurity region. For that reason, as compared with the conventional SiC semiconductor device in which the deep layer is formed so as to be in contact with the first impurity region, the extension of the depletion layer from the first deep layer is inhibited, and the current path is inhibited from being narrowed. Therefore, the on-resistance can be reduced.

The first deep layer is formed in the first current dispersion layer. In other words, the first deep layer is formed so that the first current dispersion layer is located between the bottom of the first deep layer and the first impurity region. For that reason, the depletion layer extending from the first deep layer greatly extends to the first impurity region side, and an increase in on-resistance can be inhibited.

Further, the second deep layer is formed at a position apart from the trench. For that reason, as compared with the case where the second deep layer is in contact with the trench, when carriers (for example, electrons) which have passed through the base region flow into the second current dispersion layer, the path flowing into the second current dispersion layer can be inhibited from becoming narrower. This makes it possible to inhibit an increase in on-resistance due to the second deep layer connecting the base region and the first deep layer.

According to another aspect of the present embodiments, a method for manufacturing an SiC semiconductor device having a trench gate structure includes: preparing a substrate of a first conductivity type or a second conductivity type made of SiC; forming a first impurity region made of SiC of a first conductivity type having a lower impurity concentration than the substrate on a surface of the substrate; forming a first current dispersion layer of a first conductivity type made of SiC higher in impurity concentration than the first impurity region on the first impurity region; forming a plurality of first deep layers made of SiC of a second conductivity type shallower than the first current dispersion layer and having one direction as a longitudinal direction in the first current dispersion layer by performing thermal treatment on the first current dispersion layer by ion implantation; forming a second current dispersion layer made of SiC of the first conductivity type on the first current dispersion layer; forming a second deep layer made of SiC of the second conductivity type connected to the first deep layer on the first current dispersion layer; forming a base region made of SiC of the second conductivity type on the second current dispersion layer and the second deep layer; forming a second impurity region of the first conductivity type higher in impurity concentration than the first impurity region on a surface layer portion of the base region; forming a trench having one direction as a longitudinal direction to penetrate through the base region from a surface of the second impurity region, have a bottom surface located in the second current dispersion layer and be separated from the second deep layer; forming a gate insulating film on an inner wall surface of the trench; forming a gate electrode on the gate insulating film in the trench; forming a first electrode electrically connected to the second impurity region and the base region; and forming a second electrode electrically connected to the substrate on a rear surface side of the substrate, in which in forming the first current dispersion layer, ion implantation is performed and a thermal treatment is performed in the first impurity region to form the first current dispersion layer.

According to the above configuration, a semiconductor device capable of reducing the on-resistance while inhibiting application of a high electric field to the gate insulating film can be manufactured. The first current dispersion layer is formed by ion implantation and thermal treatment. For that reason, as compared with the case where the first current dispersion layer is formed on the first impurity region by epitaxial growth, a control of the impurity concentration of the first current dispersion layer is facilitated, and variation in characteristics can be inhibited.

Incidentally, reference numerals with parentheses attached to the respective components and the like indicate an example of a correspondence relationship between the components and the like and specific components and the like described in the embodiment described later.

Embodiments of the present disclosure will be described below with reference to the drawings. In the following embodiments, the same reference numerals are assigned to parts that are the same or equivalent to each other to describe the same.

First Embodiment

Figure 2:
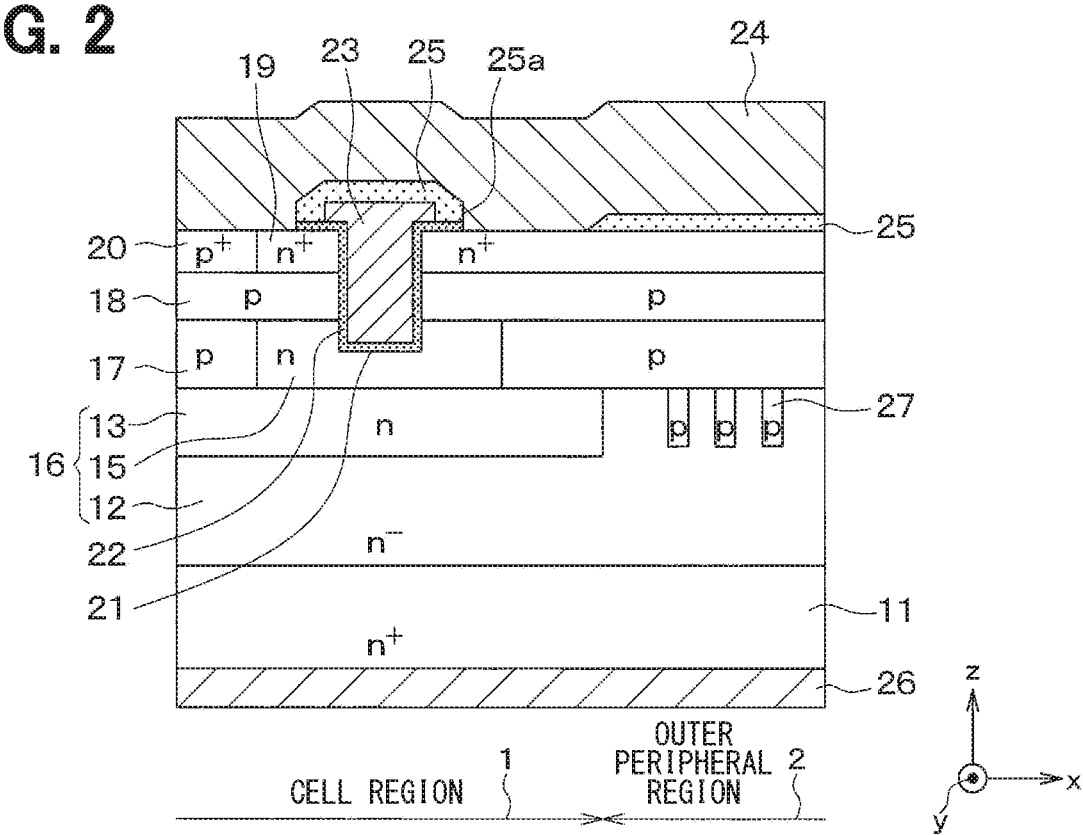
FIG. 2 is a cross-sectional view of a cell region and an outer peripheral region.
Figure 3:
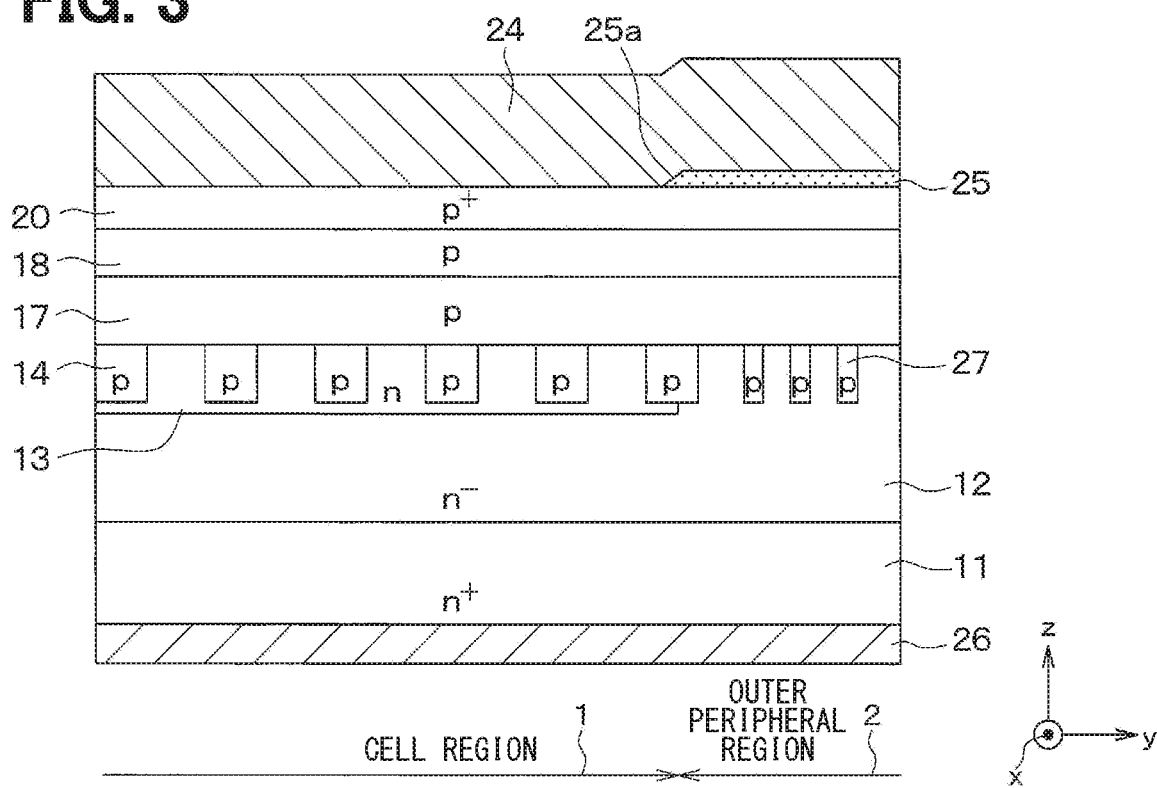
FIG. 3 is a cross-sectional view of a cell region and an outer peripheral region different from those of FIG. 2.

A first embodiment will be described with reference to FIGS. 1 to 3. As shown in FIGS. 1 to 3, an SiC semiconductor device according to the present embodiment is configured to include a cell region 1 in which a MOSFET of an inverted trench gate structure is formed, and an outer peripheral region 2 in which an outer peripheral withstand voltage structure is formed so as to surround the cell region 1. The cell region 1 in FIG. 2 corresponds to a cross-sectional view taken along a line II-II in FIG. 1, and the cell region 1 in FIG. 3 corresponds to a cross-sectional view taken along a line in FIG. 1. FIG. 1 is a perspective cross-sectional view of one cell in the cell region 1 of the MOSFET.

As shown in FIGS. 1 to 3, the SiC semiconductor device includes an $n^+$-type substrate 11 made of SiC. In the present embodiment, the substrate 11 has an off-angle of 0 to 8 degrees with respect to, for example, a (0001) Si plane, and the substrate 11 has an n-type impurity concentration of, for example, $1.0 \times 10^{19}/cm^3$, such as nitrogen or phosphorus, and a thickness of about 300 μm.

In FIGS. 1 to 3, a plane direction of the substrate 11 is an xy-plane, a <11-20> direction in the xy-plane is a y-axis direction, and a direction orthogonal to the y-axis direction is an x-axis direction. A direction normal to the plane direction of the substrate 11 is a z-axis direction.

An $n^-$-type layer 12 made of SiC having an n-type impurity concentration of nitrogen, phosphorus and the like of, for example, $5.0$ to $10.0 \times 10^{15}/cm^3$ and a thickness of about 10 μm to 15 μm is formed on a surface of the substrate 11. Although the impurity concentration of the $n^-$-type layer 12 may be kept constant in a depth direction, the concentration distribution is preferably inclined so that the concentration of the $n^-$-type layer 12 on the side of the substrate 11 is higher than that on the side of the substrate 11. For example, it is preferable that the $n^-$-type layer 12 has the impurity concentration of a portion separated by about 3 μm to 5 μm from the surface of the substrates 11 higher than that of other portions by about $2.0 \times 10^{15}/cm^3$. With the configuration described above, an internal resistance of the $n^-$-type layer 12 can be reduced, and an on-resistance of the $n^-$ layer 12 can be reduced. In the present embodiment, the $n^-$-type layer 12 corresponds to a first impurity region.

In the cell region 1, a first current dispersion layer 13 having an impurity concentration higher than that of the $n^-$-type layer 12 is formed in a surface layer portion of the $n^-$-type layer 12. The first current dispersion layer 13 is made of an n-type impurity such as nitrogen or phosphorus and has a depth of 0.3 μm to 1.5 μm. A specific impurity concentration of the first current dispersion layer 13 will be described later.

In the present embodiment, the first current dispersion layer 13 is formed only in the cell region 1. In other words, in the present embodiment, a region in which the first current dispersion layer 13 is formed in the surface layer portion of the $n^-$-type layer 12 is the cell region 1, and an area in which the first current dispersion layer 13 is not formed in the surface layer portion of the $n^-$-type layer 12 is the outer peripheral region 2.

Multiple p-type first deep layers 14 having a p-type impurity concentration of boron or the like of, for example, $2.0 \times 10^{17}$ to $2.0 \times 10^{18}$, are formed in the first current dispersion layer 13. In the present embodiment, the multiple first deep layers 14 extend along the x-axis direction so as to form stripes, and are aligned at regular intervals along the y-axis direction.

The first deep layers 14 are formed shallower than the first current dispersion layer 13. In other words, the first deep layers 14 are formed so as to have bottoms located in the first current dispersion layer 13. In other words, the first deep layers 14 are formed so that the first current dispersion layer 13 is positioned between the first deep layers 14 and the $n^-$-type layer 12.

In the present embodiment, the first deep layers 14 are formed by ion implantation as will be described later, but are formed so that a length of the first deep layers 14 in the y-axis direction is 0.3 μm or more in consideration of a processing limit of photolithography at the time of ion implantation. An interval between the adjacent first deep layers 14 along the y-axis direction, that is, a width of the first current dispersion layer 13 sandwiched between the adjacent first deep layers 14 along the y-axis direction (hereinafter, also referred to simply as the width of the first current dispersion layer 13) will be described later. However, the interval between the adjacent first deep layers 14 is narrower than an interval between adjacent trenches 21, which will be described later.

On the first current dispersion layer 13 and the first deep layers 14, a second current dispersion layer 15 having an n-type impurity concentration of nitrogen or phosphorus of, for example, $1.0 \times 10^{16}$ to $5.0 \times 10^{17}/cm^3$ and a thickness of 0.5 μm to 2 μm is formed. In the present embodiment, as will be described later, a drift layer 16 includes the $n^-$-type layer 12, the first current dispersion layer 13, and the second current dispersion layer 15.

In the second current dispersion layer 15, multiple second deep layers 17 having a p-type impurity concentration of boron or the like of, for example, $2.0 \times 10^{17}$ to $2.0 \times 10^{18}/cm^3$ and a thickness equal to that of the second current dispersion layer 15 are formed so as to penetrate through the second current dispersion layer 15. In the present embodiment, the second deep layers 17 extend along the y-axis direction. In other words, the second deep layers 17 extend in a direction intersecting with each of the first deep layers 14. Each of the second deep layers 17 is connected to the multiple first deep layers 14. The multiple second deep layers 17 are formed apart from the trenches 21 while sandwiching the trenches 21, which will be described later.

A P-type base region 18 is formed on the second current dispersion layer 15 and the second deep layers 17. n$^+$-type source regions 19 and p$^+$-type contact layers 20 are formed in a surface layer portion of the base region 18. The source regions 19 are disposed on both sides of a trench gate structure to be described later, and the contact layers 20 are provided on an opposite side of the trench gate structure across the source regions 19. In the present embodiment, the source regions 19 correspond to a second impurity region.

The base region 18 has a p-type impurity concentration of boron or the like of, for example, $5.0 \times 10^{16}$ to $2.0 \times 10^{19}/cm^3$ and a thickness of about 2.0 μm. The source regions 19 have an n-type impurity concentration (that is, surface concentration) of nitrogen, phosphorus, or the like in the surface layer portion, for example, of $1.0 \times 10^{21}/cm^3$, and a thickness of about 0.3 μm. The contact layers 20 have a p-type impurity concentration (that is, surface concentration) of boron or the like in the surface layer portion of, for example, $1.0 \times 10^{21}/cm^3$, and a thickness of about 0.3 μm.

The trench 21 having a width of, for example, 1.4 to 2.0 μm is formed so as to penetrate through the base region 18 and the source regions 19 to reach the second current dispersion layer 15 and to locate a bottom surface of the trench 21 in the second current dispersion layer 15. In other words, the trench 21 is formed so as not to reach the first current dispersion layer 13 and the first deep layers 14. In other words, the trench 21 is formed in the manner that the first current dispersion layer 13 and the first deep layers 14 are located below the bottom surface of the trench 21. Since the trench 21 is formed so as to penetrate through the base region 18 and the source regions 19, it is conceivable that the base region 18 and the source regions 19 are formed so as to be in contact with the side surfaces of the trench 21.

The trench 21 is filled with a gate insulating film 22 formed on an inner wall surface of the trench 21 and a gate electrode 23 made of doped polysilicon formed on a surface of the gate insulating film 22. As a result, the trench gate structure is formed. Although not particularly limited, the gate insulating film 22 is formed by thermally oxidizing the inner wall surface of the trench 21, and has a thickness of about 100 nm on both side surfaces and a bottom surface of the trench 21.

In the present embodiment, the trench gate structure is configured in this manner. The trench 21 extends in the y-axis direction in FIG. 1 (that is, a <−1120> direction) as the longitudinal direction. In the present embodiment, the trench 21 extends in the <11-20> direction, thereby being capable of inhibiting a facet surface from being formed on a (1-100) plane which is a side wall surface of the trench 21. In addition, since the (1-100) plane is used as a channel, an influence of channel mobility dependency can be reduced. Actually, the multiple trenches 21 are aligned along the x-axis direction in FIG. 1 so as to be shaped in a stripe. The source regions 19 and the contact layers 20 extend along the extension direction of the trench 21.

A source electrode 24 and a gate wire (not shown) are formed on surfaces of the source regions 19 and the contact layers 20 and a surface of the gate electrode 23. In the present embodiment, the source electrode 24 corresponds to a first electrode.

The source electrode 24 and the gate wire are made of multiple metals (for example, Ni/Al) and at least portions that are in contact with the n-type SiC (that is, the source regions 19 and the gate electrode 23 in the case of n-doping) are made of a metal capable of coming in an ohmic contact with the n-type SiC. In the source electrode 24 and the gate wire, at least portions that are in contact with the p-type SiC (that is, the contact layers 20 and the gate electrode 23 in the case of p-doping) are made of a metal capable of coming in an ohmic contact with p-type SiC.

The source electrode 24 and the gate wire are electrically insulated from each other by being formed on an interlayer insulating film 25. The source electrode 24 is electrically connected to the source regions 19 and the contact layers 20 through a contact hole 25a provided in the interlayer insulating film 25. As a result, the first deep layers 14 is maintained at the same potential as that of the source electrode 24 through the contact layers 20, the base region 18, and the second deep layers 17. The gate wire is electrically connected to the gate electrode 23 through the contact hole 25a provided in the interlayer insulating film 25 in a cross section different from that of FIGS. 1 to 3.

A drain electrode 26 electrically connected to the substrate 11 is formed on a rear surface side of the substrate 11. In the present embodiment, the substrate 11 functions as a drain layer. In the present embodiment, the drain electrode 26 corresponds to a second electrode.

As described above, an inverted trench gate structure MOSFET of an n-channel type is formed in the cell region 1.

As shown in FIGS. 2 and 3, in the outer peripheral region 2, the second deep layers 17 formed in the cell region 1 are extended on the n$^-$-type layer 12. Multiple P-type guard rings 27 connected to the second deep layers 17 and surrounding the cell region 1 are formed in the surface layer portion of the n$^-$-type layer 12. In the present embodiment, the guard rings 27 have the same impurity concentration and the same depth as those of the first current dispersion layer 13. As described above, the first current dispersion layer 13 is not formed in the outer peripheral region 2.

The configuration of the SiC semiconductor device according to the present embodiment is described above. Next, the operation of the SiC semiconductor device will be described.

First, in the SiC semiconductor device, an inversion layer is not formed in the base region 18 in an off-state before a gate voltage is applied to the gate electrode 23. For that reason, even if a positive voltage (for example, 1600 V) is applied to the drain electrode 26, electronics do not flow from the source regions 19 into the base region 18, and no current flows between the source electrode 24 and the drain electrode 26.

In addition, in a state before a gate voltage is applied to the gate electrode 23, an electric field is applied between the drain and the gate, and an electric field concentration may occur at a bottom of the gate insulating film 22. However, in the SiC semiconductor device, the first deep layers 14 and the first current dispersion layer 13 are provided at positions deeper than the trench 21. For that reason, in the above SiC semiconductor device, a depletion layer formed between the first deep layers 14 and the first current dispersion layer 13 makes it difficult for a high electric field due to an influence of the drain voltage to enter the gate insulating film 22. Therefore, in the present embodiment, breakdown of the gate insulating film 22 can be inhibited.

In the SiC semiconductor device, when a predetermined gate voltage (for example, 20 V) is applied to the gate electrode 23, a channel is provided in the surface of the base region 18 which is in contact with the trench 21. For that reason, the electrons injected from the source electrode 24 pass through the channel extended to the base region 18 from the source regions 19, and then flow into the second current dispersion layer 15. The electrons flowing through the second current dispersion layer 15 pass through the first current dispersion layer 13 to the n⁻-type layer 12, and then pass through the substrate 11 as a drain layer to the drain electrodes 26. As a result, a current flows between the source electrode 24 and the drain electrode 26, and the SiC semiconductor device is turned on. In the present embodiment, since the electrons having passed through the channels pass through the second current dispersion layer 15, the first current dispersion layer 13, and the n⁻-type layer 12 to flow to the substrate 11, it is conceivable that the drift layer 16 includes the second current dispersion layer 15, the first current dispersion layer 13, and the n⁻-type layer 12.

At that time, a reverse bias is applied between the first deep layers 14 and the second deep layers 17, and the first current dispersion layer 13 and the second current dispersion layer 15, so that the depletion layer extends. However, in the present embodiment, the first current dispersion layer 13 and the second current dispersion layer 15 are higher in impurity concentration than the n⁻-type layer 12. For that reason, as compared with the conventional SiC semiconductor device in which the deep layer is formed so as to be in contact with the drift layer, the expansion of the depletion layer extending from the first deep layers 14 is inhibited. For that reason, the narrowing of the current path is inhibited, and the on-resistance can be reduced.

The operation of the SiC semiconductor device according to the present embodiment is described above. Next, a specific impurity concentration and width of the first current dispersion layer 13 will be described.

Figure 4:
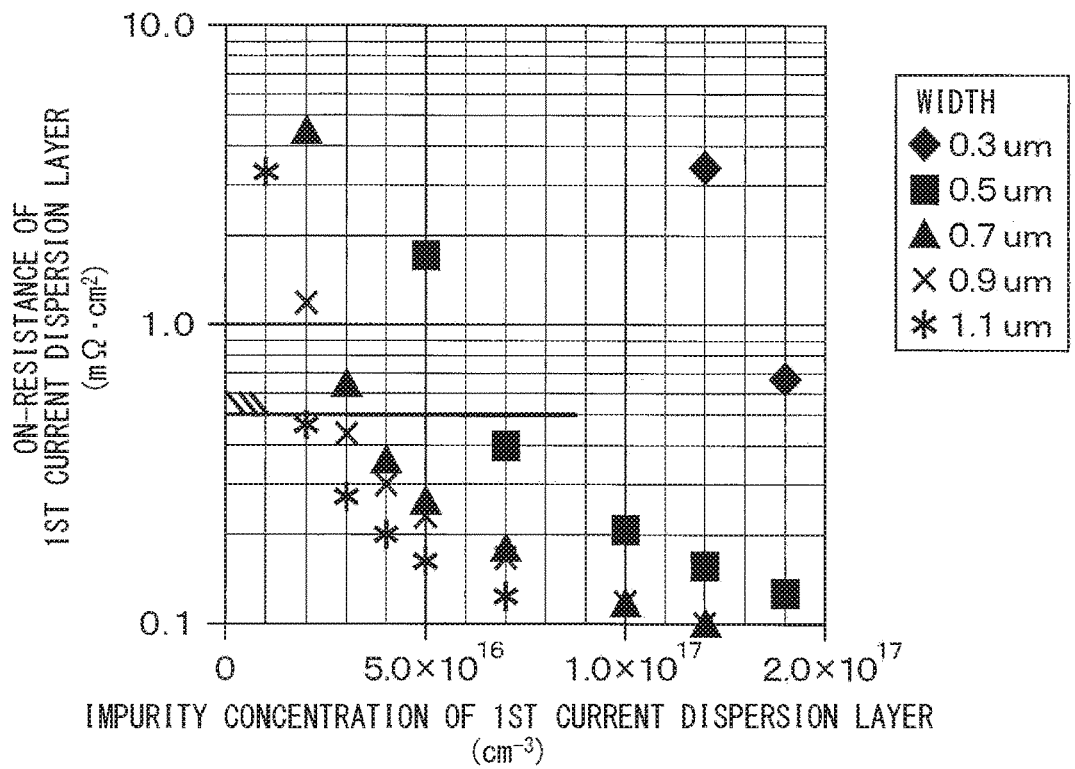
FIG. 4 is a graph showing a simulation result of an impurity concentration and a width of a first current dispersion layer and an on-resistance of the first current dispersion layer.

First, as shown in FIG. 4, the on-resistance of the first current dispersion layer 13 decreases as the impurity concentration of the first current dispersion layer 13 increases. More specifically, the on-resistance of the first current dispersion layer 13 sharply decreases as the impurity concentration increases in a range of 0.5 mΩ·cm² or more, and gradually decreases as the impurity concentration increases in a range of less than 0.5 mΩ·cm². The on-resistance also depends on the width of the first current dispersion layer 13, and becomes lower as the width of the first current dispersion layer 13 becomes wider. For that reason, in the present embodiment, the impurity concentration and widths of the first current dispersion layers 13 are set so that the on-resistance is less than 0.5 mΩ·cm².

Figure 5:
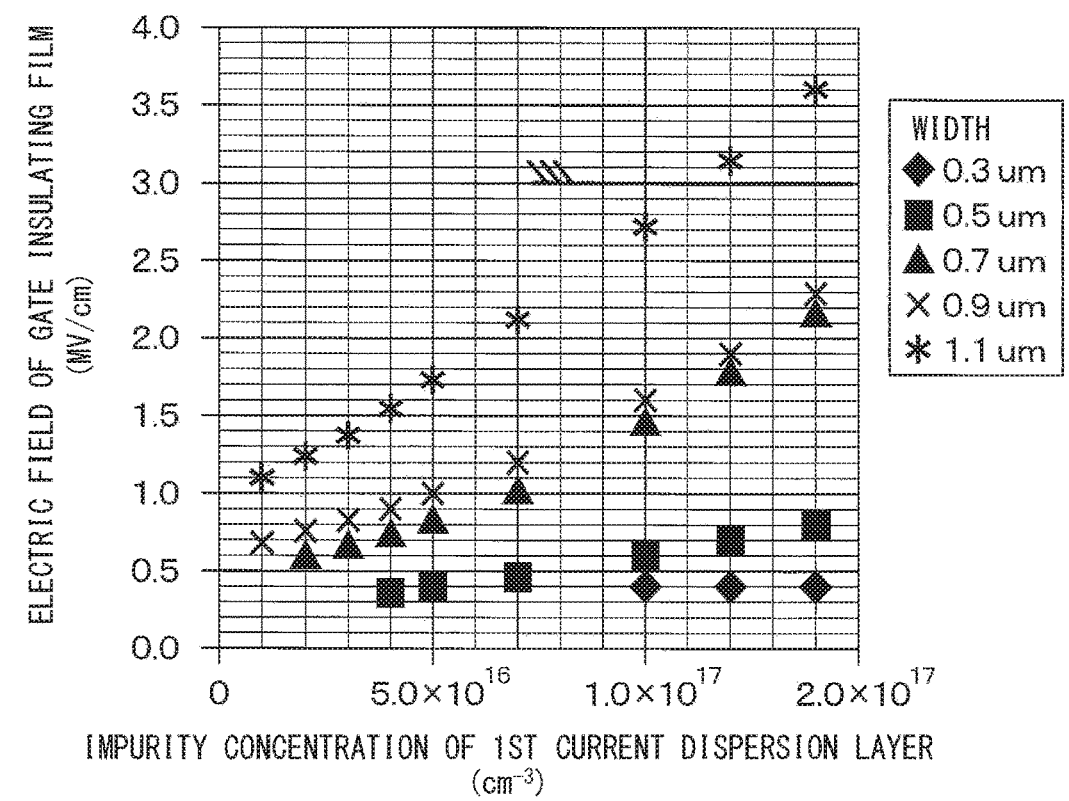
FIG. 5 is a graph showing simulation results of the impurity concentration and the width of the first current dispersion layer and an electric field applied to a gate insulating film.

Next, as shown in FIG. 5, an electric field to be applied to the gate insulating film 22 at the time of OFF increases as the impurity concentration of the first current dispersion layer 13 increases, and increases as the width of the first current dispersion layer 13 increases. In this example, in the SiC semiconductor device having the trench gate structure as in the present embodiment, if the electric field applied to the gate insulating film 22 is less than 3.0 MV/cm, the SiC semiconductor device is generally highly reliable. Therefore, in the present embodiment, the impurity concentration and width of the first current dispersion layers 13 are set so that the electric field applied to the gate insulating film 22 is less than 3.0 MV/cm.

Figure 6:
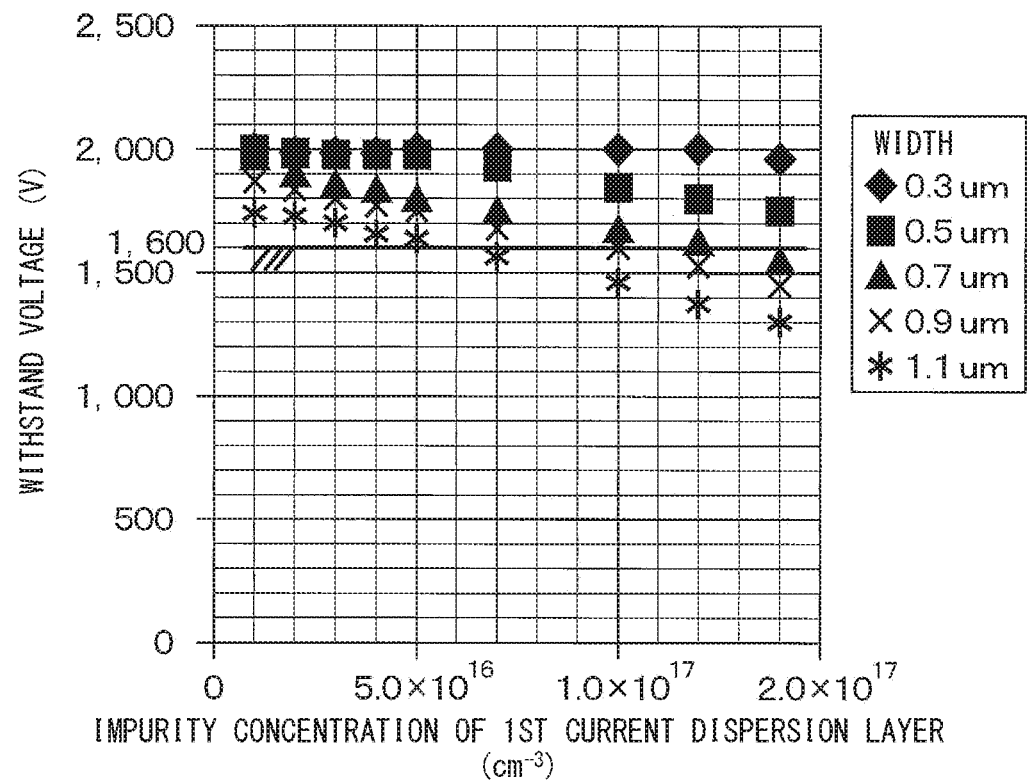
FIG. 6 is a graph showing simulation results of the impurity concentration and the width of the first current dispersion layer and a breakdown voltage.

Further, as shown in FIG. 6, a breakdown voltage becomes lower as the impurity concentration of the first current dispersion layer 13 becomes higher, and becomes lower as the width of the first current dispersion layer 13 becomes wider. In this example, in the SiC semiconductor device having the trench gate structure as in the present embodiment, the withstand voltage of 2000 V is theoretically maximized at present, and the withstand voltage is sufficiently high if the withstand voltage is 1600 V. For that reason, in the present embodiment, the impurity concentration and the width of the first current dispersion layer 13 are set so that the breakdown voltage becomes 1600 V or more.

Figure 7:
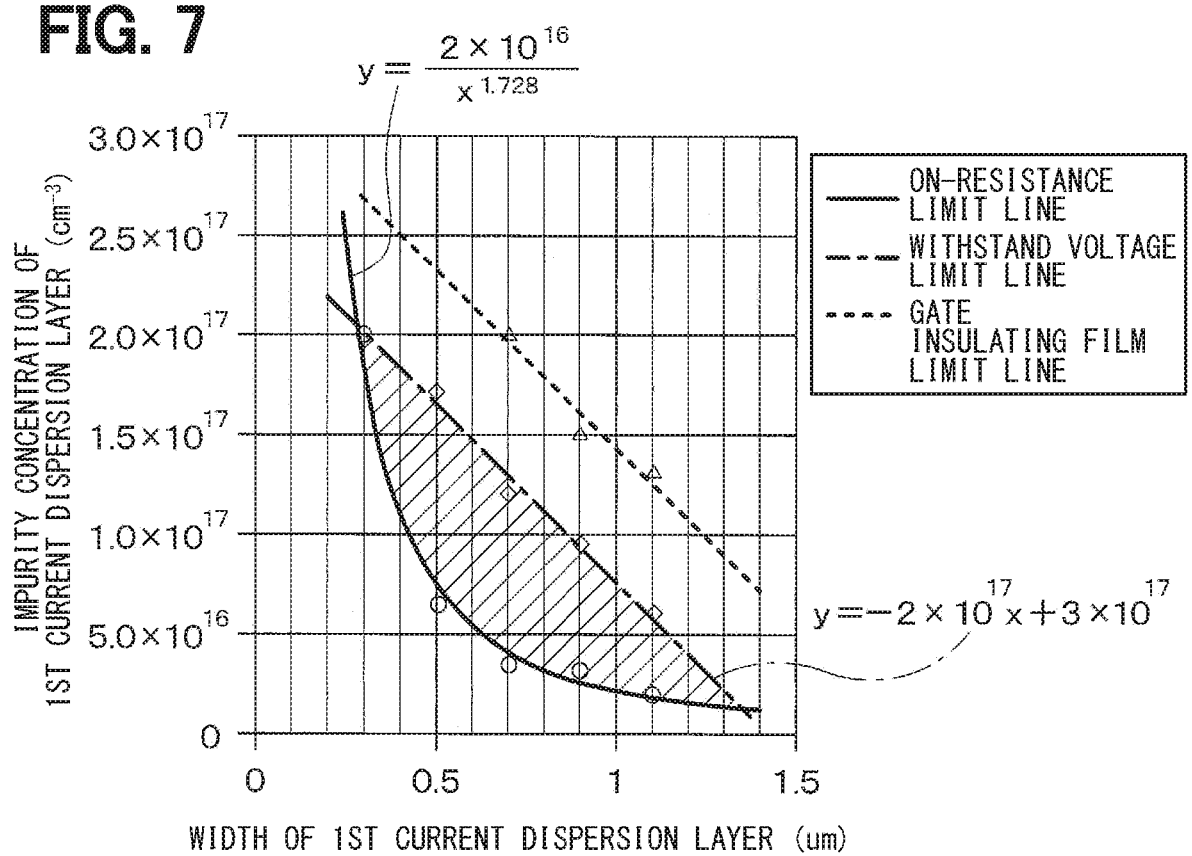
FIG. 7 is a graph showing the results of an on-resistance, an electric field applied to the gate insulating film, a withstand voltage, and an impurity concentration and a width of the first current dispersion layer.

FIGS. 4 to 6 are summarized as shown in FIG. 7. Specifically, in FIG. 7, a hatched portion is a region that satisfies all of the on-resistance of the first current dispersion layer 13 of FIG. 4, the electric field applied to the gate insulating film 22 of FIG. 5, and the breakdown voltage of FIG. 6.

For that reason, in the present embodiment, when the impurity concentration of the first current dispersion layer 13 is defined as y [cm⁻³] and the width of the first current dispersion layer 13 is defined as x [μm], a relationship of $2 \times 10^{16}/x^{1.728} < y < -2 \times 10^{17}x + 3 \times 10^{17}$ is satisfied. As a result, in the present embodiment, the electric field applied to the gate insulating film 22 can be reduced while the on-resistance is reduced, and a decrease in the withstand voltage can be also inhibited. In the present embodiment, since each of the multiple first deep layers 14 extends along the x-axis direction, the width of the first current dispersion layer 13 corresponds to a length of the narrowest portion of the first current dispersion layer 13.

Next, a method for manufacturing the SiC semiconductor device according to the present embodiment will be described with reference to FIGS. 8A to 8J and FIGS. 9A to 9H. FIGS. 8A to 8J are cross-sectional views corresponding to FIG. 2, and FIGS. 9A to 9H are cross-sectional views corresponding to FIG. 3.

Figure 8A:
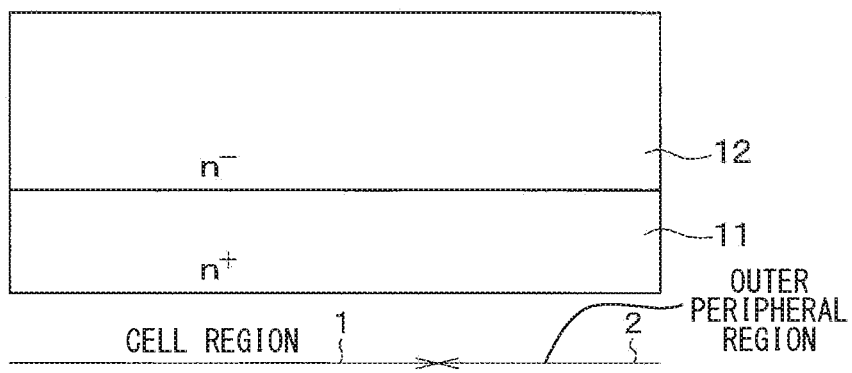
FIG. 8A is a cross-sectional view showing a process of manufacturing the SiC semiconductor device shown in FIG. 2.
Figure 9A:
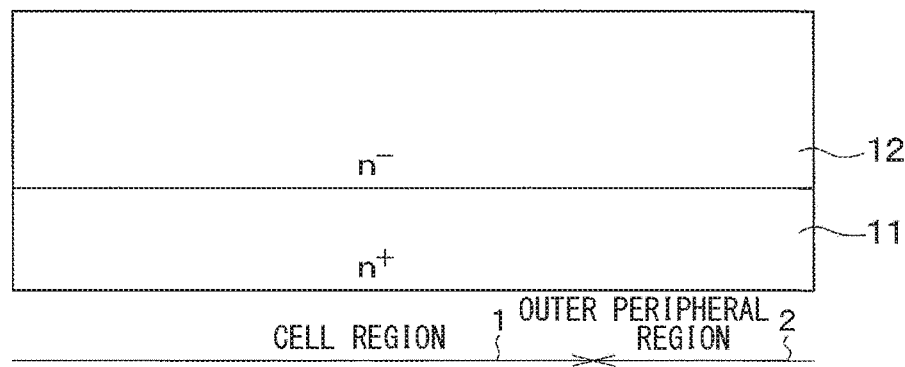
FIG. 9A is a cross-sectional view showing a process of manufacturing the SiC semiconductor device shown in FIG. 3.

First, as shown in FIGS. 8A and 9A, the n⁺-type substrate 11 is prepared. Then, the n⁻-type layer 12 made of SiC is epitaxially grown on the surface of the substrate 11. As the substrate 11, a substrate having an area capable of configuration the cell region 1 and the outer peripheral region 2 is used.

Figure 8B:
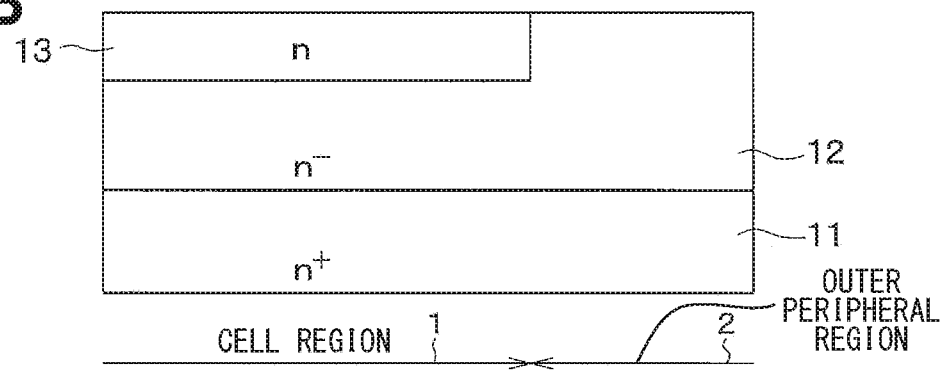
FIG. 8B is a cross-sectional view showing a process of manufacturing the SiC semiconductor device subsequent to FIG. 8A.
Figure 9B:
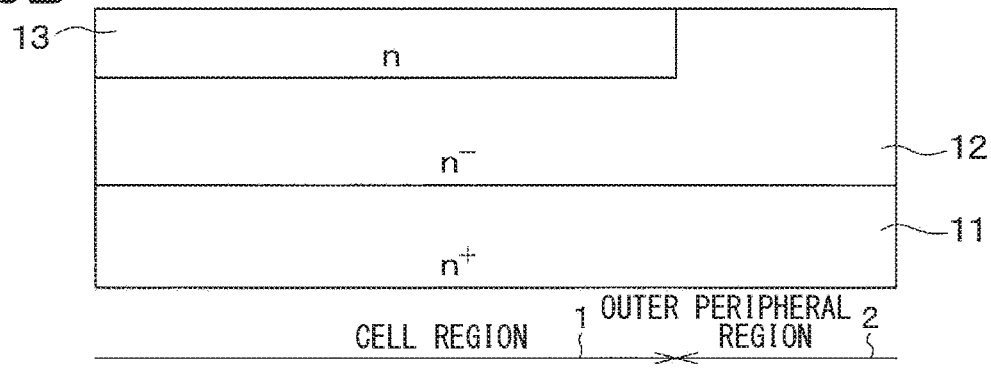
FIG. 9B is a cross-sectional view showing a process of manufacturing the SiC semiconductor device subsequent to FIG. 9A.

Next, as shown in FIG. 8B and FIG. 9B, a mask (not shown) is formed on the surface of the n⁻-type layer 12, and the mask is patterned by photolithography or the like so that a region in which the first current dispersion layer 13 is to be formed is opened. Specifically, the mask is patterned so that only the cell region 1 is opened. Then, an n-type impurity such as nitrogen or phosphorus is ion-implanted from above the mask and subjected to a thermal treatment to form the first current dispersion layer 13 only in the cell region 1. Thereafter, the mask is removed. As the mask, for example, an LTO (that is, Low Temperature Oxide) film or the like is used. In the present embodiment, although a mask is used also in a process to be described later, for example, an LTO film or the like is used as each mask.

In the present embodiment, the first current dispersion layer 13 is formed by ion implantation. For that reason, as compared with the case in which the first current dispersion layer 13 is formed of an epitaxial film, the impurity concentration of the first current dispersion layer 13 can be easily controlled, and variations in characteristics can be inhibited.

Figure 8C:
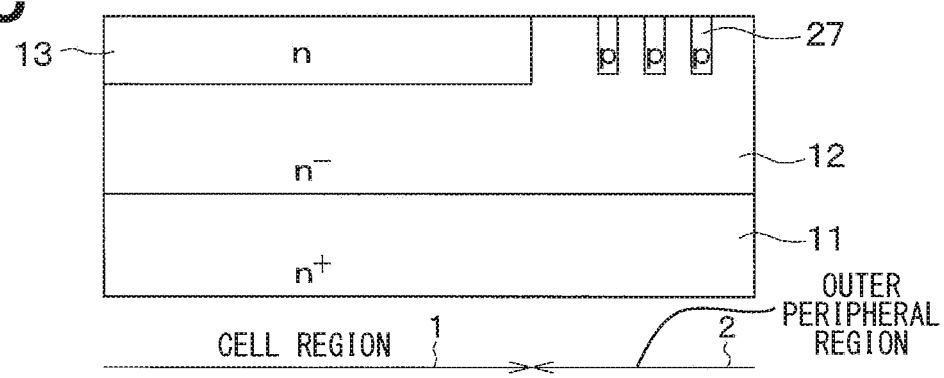
FIG. 8C is a cross-sectional view showing a process of manufacturing the SiC semiconductor device subsequent to FIG. 8B.
Figure 9C:
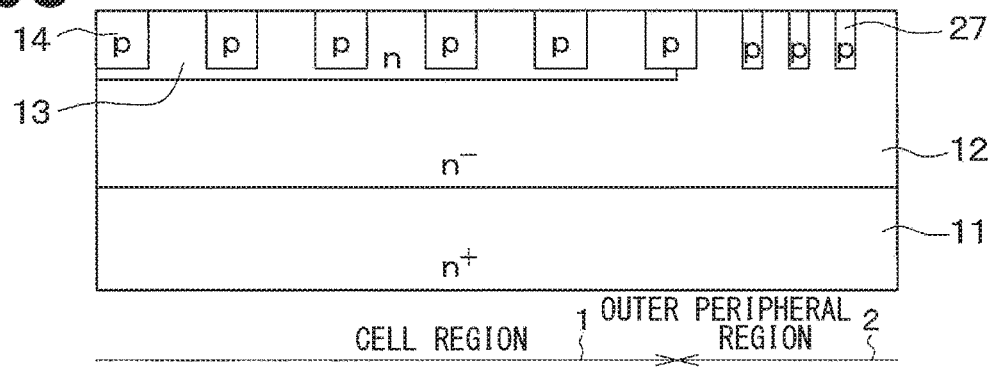
FIG. 9C is a cross-sectional view showing a process of manufacturing the SiC semiconductor device subsequent to FIG. 9B.

Next, as shown in FIG. 8C and FIG. 9C, a mask (not shown) is formed, and the mask is patterned by photolithography or the like so that regions in which the first deep layers 14 and the guard rings 27 are to be formed are opened. Then, p-type impurities such as boron are ion-implanted from above the mask and subjected to a thermal treatment to form the first deep layers 14 and the guard rings 27. In other words, in the present embodiment, the first deep layers 14 and the guard rings 27 are formed in the same process.

As described above, the first deep layers 14 have a stripe shape and are formed shallower than the first current dispersion layer 13. As described above, the first current dispersion layer 13 and the first deep layers 14 are formed so as to satisfy $2\times10^{16}/x^{1.728} < y < -2\times10^{17}x + 3\times10^{17}$.

Figure 8D:
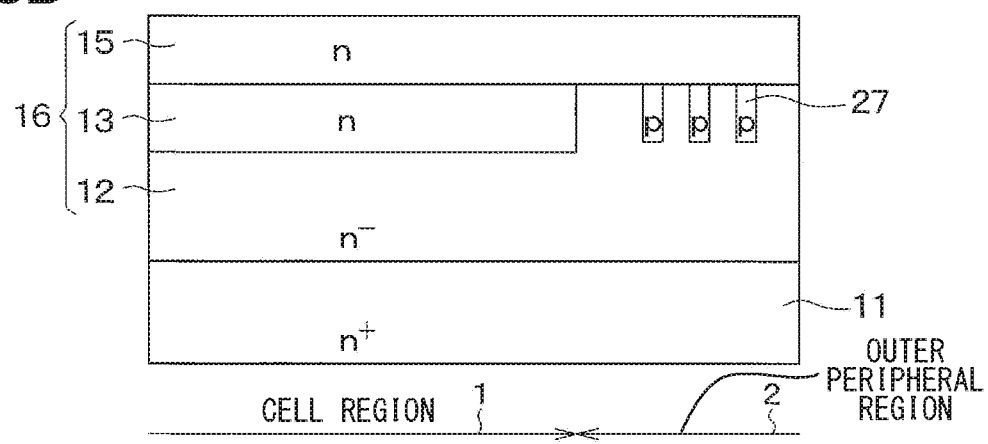
FIG. 8D is a cross-sectional view showing a process of manufacturing the SiC semiconductor device subsequent to FIG. 8C.
Figure 9D:
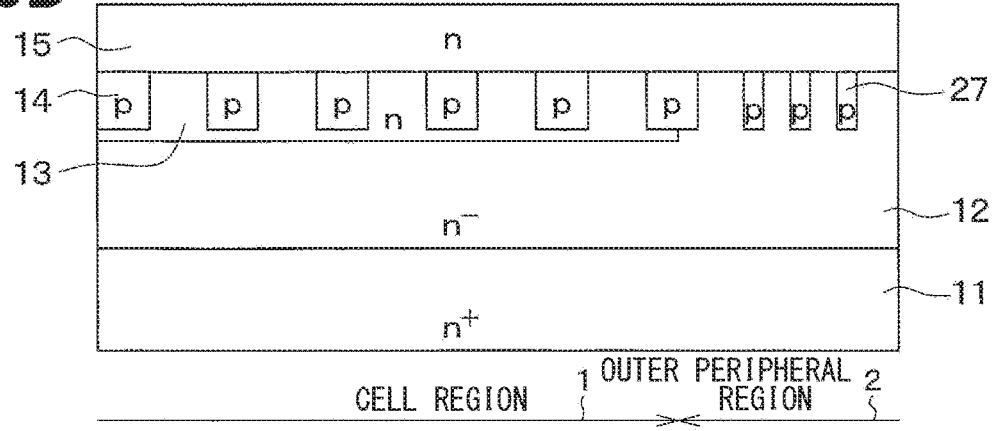
FIG. 9D is a cross-sectional view showing a process of manufacturing the SiC semiconductor device subsequent to FIG. 9C.

Subsequently, as shown in FIG. 8D and FIG. 9D, the second current dispersion layer 15 made of SiC is epitaxially grown on the n⁻-type layer 12. As a result, the drift layer 16 having the n⁻-type layer 12, the first current dispersion layer 13, and the second current dispersion layer 15 is formed.

Figure 8E:
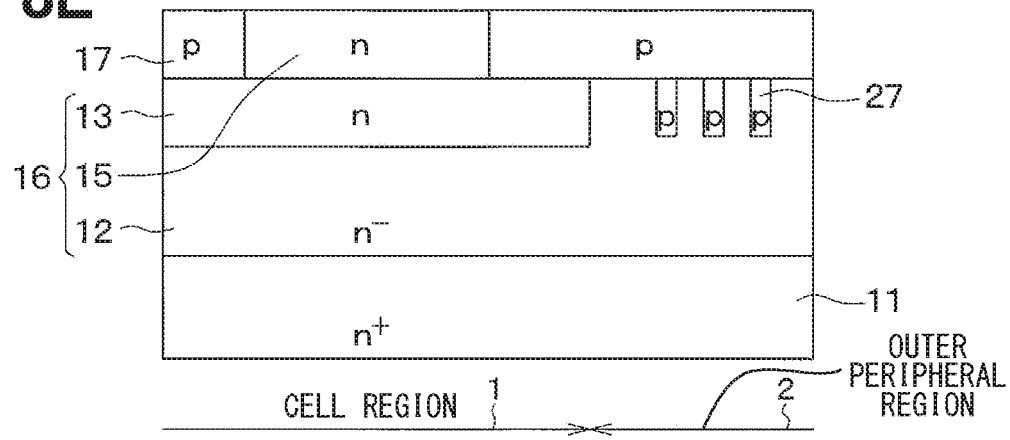
FIG. 8E is a cross-sectional view showing a process of manufacturing the SiC semiconductor device subsequent to FIG. 8D.
Figure 9E:
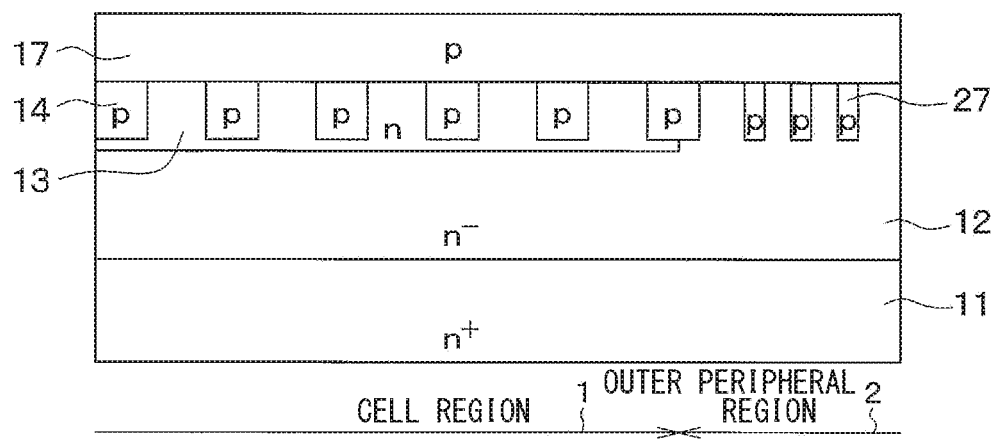
FIG. 9E is a cross-sectional view showing a process of manufacturing the SiC semiconductor device subsequent to FIG. 9D.

Next, as shown in FIG. 8E and FIG. 9E, a mask (not shown) is formed, and the mask is patterned by photolithography or the like so that regions where the second deep layers 17 are to be formed are opened. Then, p-type impurities such as boron are ion-implanted from above the mask and subjected to a thermal treatment to form the second deep layers 17.

At this time, the second deep layers 17 are extended in a direction intersecting with the extension direction of the first deep layers 14. For that reason, even if there is some positional deviation in forming the second deep layers 17, a problem that the first deep layers 14 and the second deep layers 17 are not connected to each other can be inhibited from occurring.

Figure 8F:
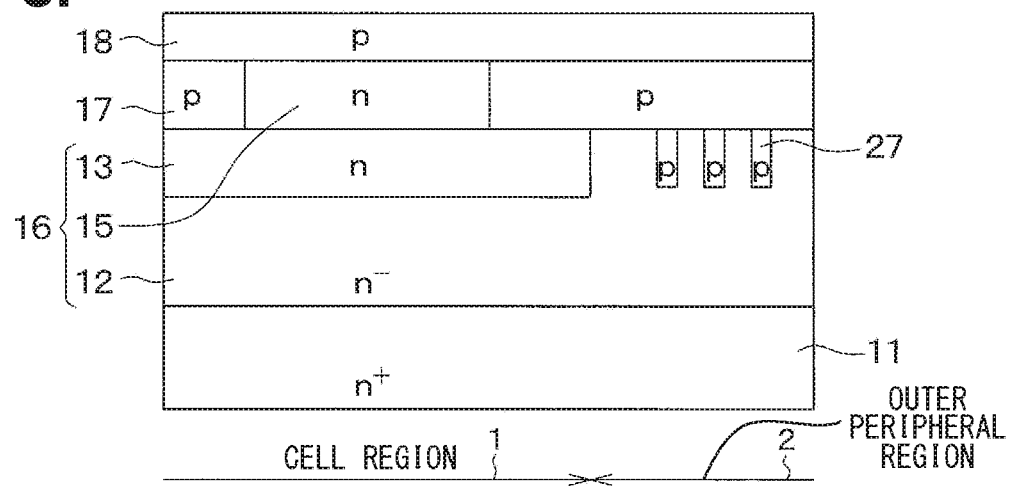
FIG. 8F is a cross-sectional view showing a process of manufacturing the SiC semiconductor device subsequent to FIG. 8E.
Figure 9F:
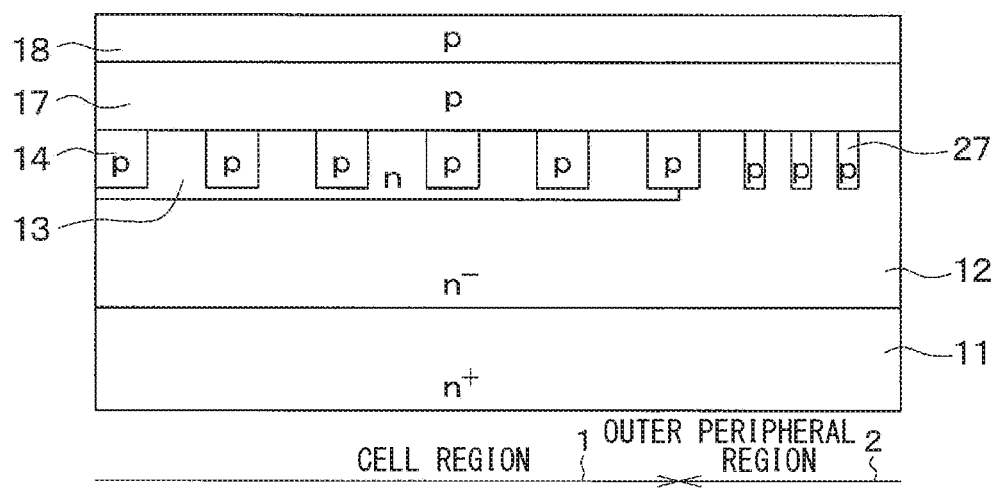
FIG. 9F is a cross-sectional view showing a process of manufacturing the SiC semiconductor device subsequent to FIG. 9E.

Next, as shown in FIG. 8F and FIG. 9F, a p-type impurity layer is epitaxially grown on the second current dispersion layer 15 and the second deep layers 17 to form the base region 18.

Figure 8G:
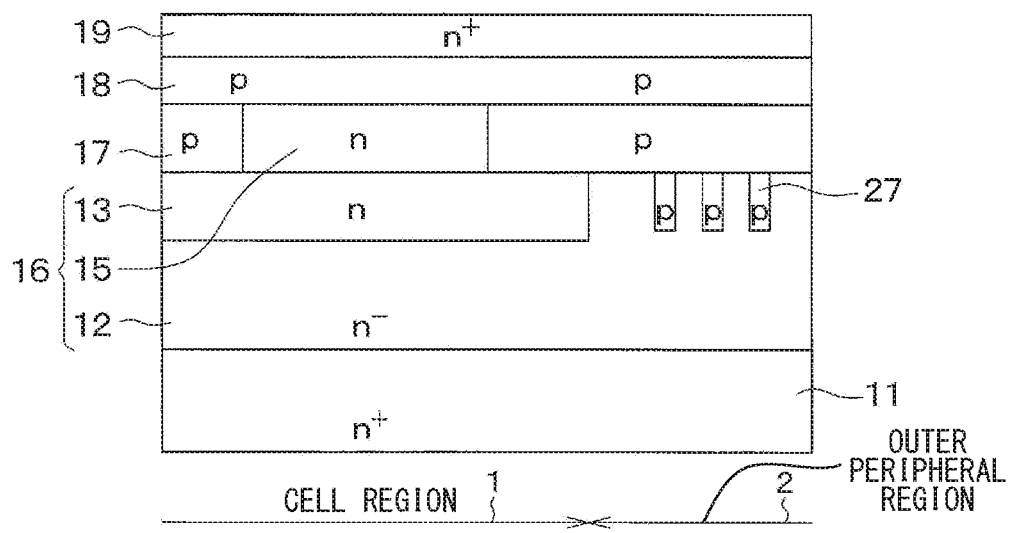
FIG. 8G is a cross-sectional view showing a process of manufacturing the SiC semiconductor device subsequent to FIG. 8F.
Figure 9G:
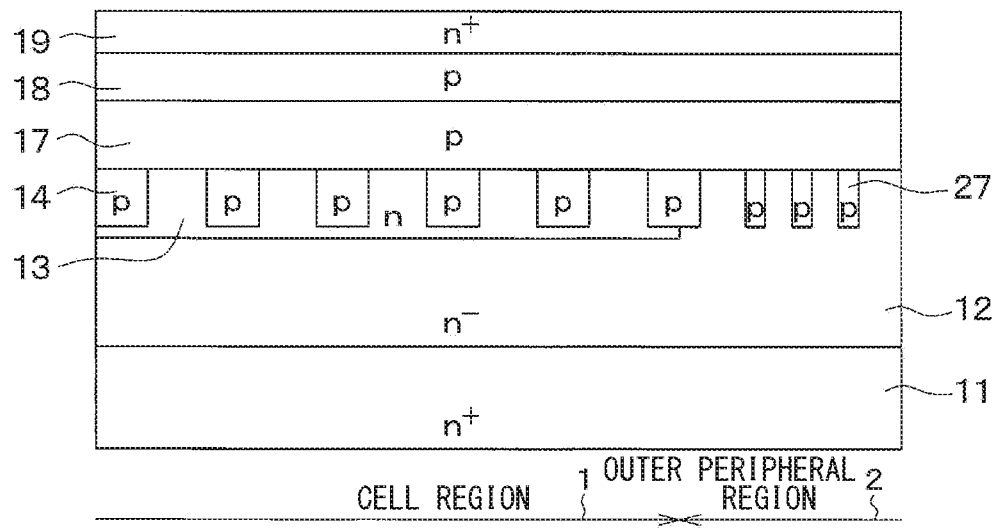
FIG. 9G is a cross-sectional view showing a process of manufacturing the SiC semiconductor device subsequent to FIG. 9F.

Subsequently, as shown in FIG. 8G and FIG. 9G, an n-type impurity layer is epitaxially grown on the base region 18 to form the source regions 19.

Figure 9H:
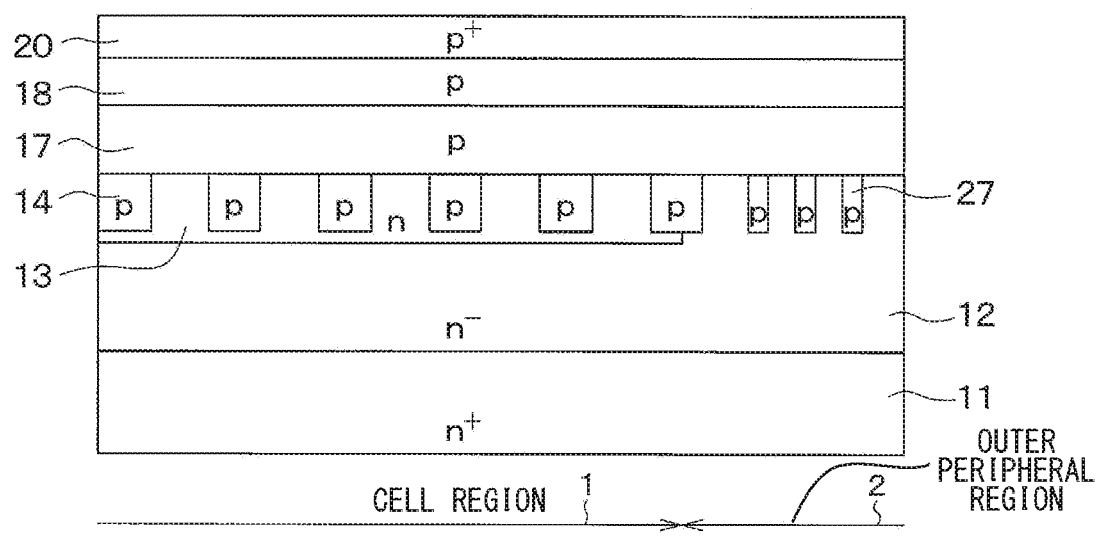
FIG. 9H is a cross-sectional view showing a process of manufacturing the SiC semiconductor device subsequent to FIG. 9G.

Then, a mask (not shown) is formed as shown in FIGS. 8H and 9H, and the mask is patterned by photolithography or the like so that regions in which the contact layers 20 are to be formed are opened. Then, p-type impurities such as boron are ion-implanted from above the mask and subjected to a thermal treatment to form the contact layers 20.

Next, as shown in the FIG. 8I, a mask (not shown) is formed, and then the mask is patterned so that the region where the trench 21 is formed is opened. Then, anisotropic etching is performed to form the trench 21. More specifically, the trench 21 is formed so as to penetrate through the source regions 19 and the base region 18 and so that the bottom of the trench 21 is located in the second current dispersion layer 15. In other words, the trench 21 is formed so that the first current dispersion layer 13 and the first deep layers 14 are located below the bottom surface of the trench 21. After anisotropic etching, isotropic etching or sacrificial layer oxidation may be performed as necessary.

Next, as shown in the FIG. 8J, the gate insulating film 22 is formed at a location including the inside of the trench 21. Specifically, the gate insulating film 22 is formed by gate oxidation (that is, thermal oxidation) by a pyrogenic method using a wet atmosphere. Subsequently, a polysilicon layer doped with an n-type impurity is formed on the surface of the gate insulating film 22 to a thickness of about 440 nm at a temperature of, for example, 600° C., and then an etch-back process or the like is performed so that the gate insulating film 22 and the gate electrode 23 remain in the trench 21. As a result, the trench gate structure is formed.

The subsequent steps are the same as those in the related art, and therefore are not shown in the figure, but briefly described, first, the interlayer insulating film 25 is formed. Then, the contact hole 25a from which a part of the source regions 19 and the contact layers 20 are exposed and a contact hole from which a part of the gate electrode 23 is exposed are formed. Next, an electrode material is formed so as to fill each contact hole 25a, and then the electrode material is patterned to form the source electrode 24 and the gate wire. The drain electrode 26 is formed on the rear surface side of the substrate 11. As described above, the SiC semiconductor device according to the present embodiment is manufactured.

As described above, in the present embodiment, the first current dispersion layer 13 having an impurity concentration higher than that of the n⁻-type layer 12 and the first deep layers 14 formed in the first current dispersion layer 13 are provided at positions deeper than the trench 21. For that reason, a high electric field hardly enters the gate insulating film 22, and breakdown of the gate insulating film 22 can be inhibited.

In addition, since the first current dispersion layer 13 has a higher impurity concentration than the n⁻-type layer 12, the expansion of the depletion layer extending from the first deep layers 14 is inhibited as compared with the conventional SiC semiconductor device in which the deep layer is formed so as to be in contact with the drift layer. For that reason, the first deep layers 14 inhibits the narrowing of the current path, and the on-resistance can be reduced.

Further, the first current dispersion layer 13 and the first deep layers 14 are formed at positions deeper than the trench 21. For that reason, even if an alignment deviation or the like occurs when the first deep layers 14 is formed, the first deep layers 14 and the trench 21 can be inhibited from coming into contact with each other.

The first deep layers 14 is formed in the first current dispersion layer 13. In other words, the first deep layers 14 are formed so that the first current dispersion layer 13 is positioned between the bottoms of the first deep layers 14 and the n⁻-type layer 12. For that reason, the depletion layer extending from the first deep layers 14 greatly extends toward the n⁻-type layer 12, and the on-resistance can be inhibited from increasing.

Further, the second deep layers 17 extends in a direction intersecting with the extension direction of the first deep layers 14. For that reason, as compared with the case where the second deep layers 17 are extended along the extension direction of the first deep layers 14, a problem that the second deep layers 17 and the first deep layers 14 are not connected to each other when a positional deviation or the like occurs can be inhibited from occurring. In other words, a problem that the first deep layers 14 are in a floating state can be inhibited from occurring.

The second deep layers 17 mainly functions to connect the first deep layers 14 and the base region 18 (that is, the source electrode 24) and are formed at positions away from the trench 21. For that reason, as compared with the case where the second deep layers 17 are in contact with the trench 21, when electrons that have passed through a channel provided in the base region 18 flow into the second current dispersion layer 15, the path that flows into the second current dispersion layer 15 can be inhibited from becoming narrower. This makes it possible to inhibit an increase in the on-resistance.

Further, the second current dispersion layer 15 is higher in impurity concentration than the n⁻-type layer 12. For that reason, for example, as compared with the case where the second current dispersion layer 15 has the same impurity concentration as that of the n⁻-type layer 12, the expansion of the depletion layer extending from the second deep layers 17 is also inhibited. In other words, the current path in the first current dispersion layer 13 can be inhibited from narrowing. This makes it possible to inhibit an increase in the on-resistance.

The first current dispersion layer 13 and the first deep layers 14 are formed to have an impurity concentration of y

[cm$^{-3}$] in the first current dispersion layer 13 and a width of x [μm] in the first current dispersion layer 13 so as to satisfy a relationship of $2\times10^{16}/x^{1.728} < y < -2\times10^{17}x + 3\times10^{17}$. This makes it possible to reduce the electric field applied to the gate insulating film 22 while reducing the on-resistance, and makes it also possible to inhibit a decrease in the withstand voltage.

Further, the first current dispersion layer 13 is formed only in the cell region 1 and is not formed in the outer peripheral region 2. For that reason, in the outer peripheral region 2, the depletion layer is easily expanded, and an interval between equipotential lines is easily expanded, so that the electric field concentration is hardly generated. Therefore, the degree of freedom of design can be improved.

The first current dispersion layer 13 is formed by ion implantation. For that reason, as compared with the case in which the first current dispersion layer 13 is formed of an epitaxial film, the impurity concentration of the first current dispersion layer 13 can be easily controlled, and variations in characteristics can be inhibited.

Second Embodiment

A second embodiment will be described. In the second embodiment, a configuration of first deep layers 14 is changed, and the other configuration is the same as that of the first embodiment, and therefore a description of the same configuration will be omitted.

Figure 10:
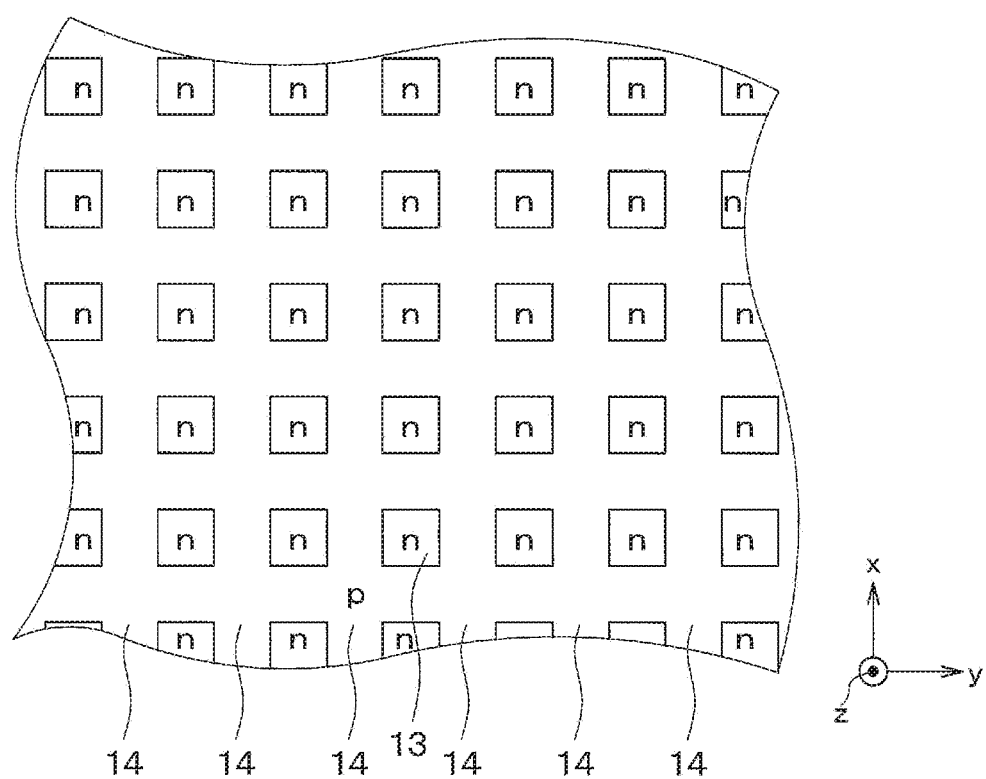
FIG. 10 is a schematic plan view showing a positional relationship between a first current dispersion layer and a first deep layer according to a second embodiment.

In the present embodiment, as shown in FIG. 10, multiple first deep layers 14 extend along an x-axis direction. Adjacent first deep layers 14 are connected to each other at multiple points. In other words, in the present embodiment, it is conceivable that the first deep layers 14 are formed in a lattice shape. In the present embodiment, a length of the narrowest portion of a first current dispersion layer 13 is the width x. In other words, for example, in FIG. 10, the first current dispersion layer 13 has a square planar shape in a portion surrounded by the first deep layers 14, but when the planar shape is a rectangle, a length of short sides is the width x.

As described above, in the present embodiment, the first deep layers 14 are formed in a lattice shape. For that reason, the same effects as those of the first embodiment can be obtained while further inhibiting the occurrence of the problem that the first deep layers 14 and the second deep layers 17 are not connected to each other.

Other Embodiments

Although the present disclosure has been described in accordance with embodiments, it is understood that the present disclosure is not limited to such embodiments or structures. The present disclosure encompasses various modifications and variations within the scope of equivalents. In addition, various combinations and configurations, as well as other combinations and configurations that include only one element, more, or less, fall within the scope and spirit of the present disclosure.

For example, in each of the above embodiments, an n-channel type MOSFET in which the first conductivity type is an n-type and the second conductivity type is a p-type has been described as an example, but a p-channel type MOSFET in which the conductivity type of each component is inverted may be used. In the above embodiments, the MOSFET of the trench gate structure has been exemplified, but an IGBT of the same trench gate structure may be applied. The IGBT only changes the conductivity type of the substrate 11 from the n-type to the p-type in each of the above embodiments, and the structures and manufacturing methods are the same as those in each of the above embodiments.

Figure 11:
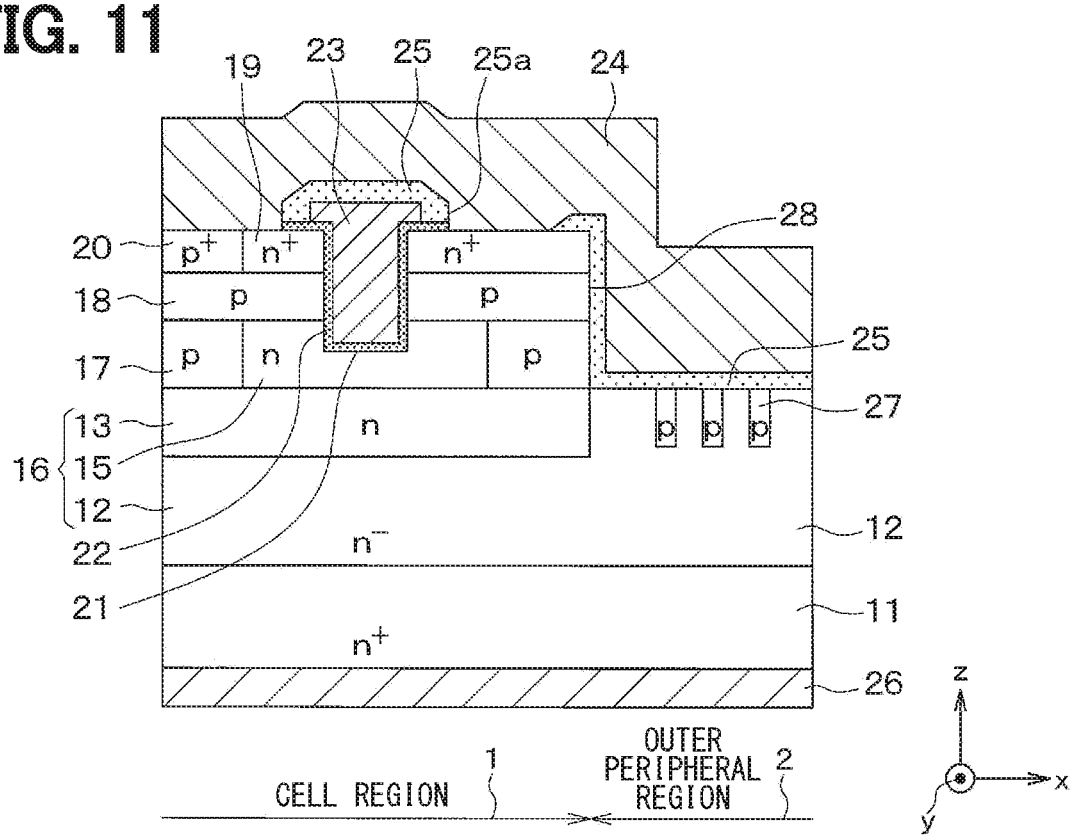
FIG. 11 is a cross-sectional view of an SiC semiconductor device according to another embodiment.
Figure 12:
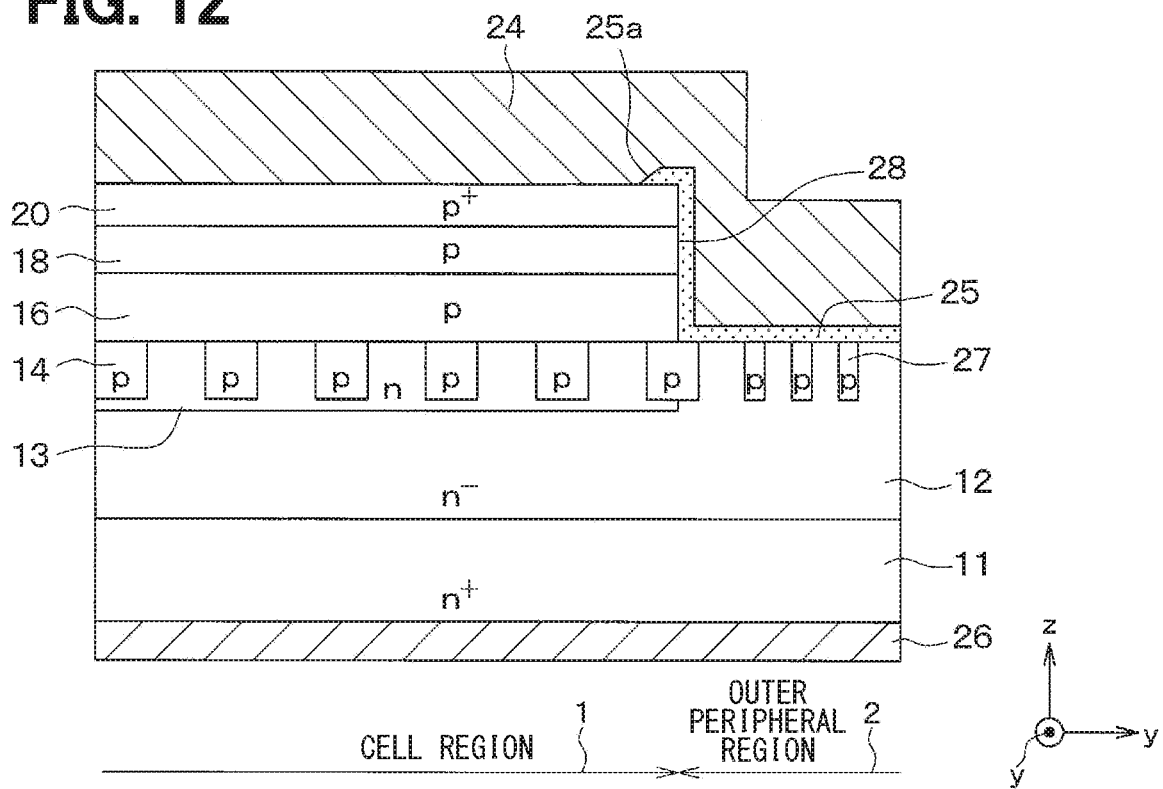
FIG. 12 is a cross-sectional view of an SiC semiconductor device according to another embodiment.

In each of the above embodiments, the outer peripheral region 2 may have a mesa structure. In other words, as shown in FIGS. 11 and 12, the outer peripheral region 2 may have a mesa structure in which a recess portion 28 that penetrates through the source regions 19 and the base region 18 and reaches the n$^-$-type layer 12 is provided. The cell region 1 in FIG. 11 corresponds to a cross section along a line II-II in FIG. 1, and the cell region 1 in FIG. 12 corresponds to a cross section along a line III-III in FIG. 1.

In each of the above embodiments, the multiple second deep layers 17 are not formed, and only second deep layers 17 may be formed. Similarly, in such an SiC semiconductor device, one second deep layers 17 is connected to each of the first deep layers 14, thereby being capable of obtaining the same effects as those of each of the above embodiments.

Further, in each of the above embodiments, the first deep layers 14 may extend along the y-axis direction, for example. In other words, the first deep layers 14 may extend in the same direction as that of the second deep layers 17. In each of the above embodiments, the second current dispersion layer 15 may have, for example, the same impurity concentrations as those of the n$^-$-type layer 12. The first current dispersion layer 13 may also be formed in the outer peripheral region 2. Further, the first current dispersion layer 13 and the first deep layers 14 may not be formed so as to satisfy $2\times10^{16}/x^{1.728} < y < -2\times10^{17}x + 3\times10^{17}$.

In each of the above embodiments, the contact layers 20 may not be formed. In other words, the source electrode 24 may be connected to the base region 18.

In each of the above embodiments, the gate insulating film 22 may include an oxide film, a nitride film, or the like that is not formed by thermal oxidation.

Further, in each of the above embodiments, after the contact layers 20 has been formed by epitaxially growing a p-type impurity layer on the base region 18, the source regions 19 may be formed.

It should be noted that if the crystal orientation is to be indicated, a bar (−) should originally be attached above the desired number, but since there are restrictions on the representation based on the electronic application, the bar is attached before the desired number in the present specification.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A silicon carbide semiconductor device having a trench gate structure, the silicon carbide semiconductor device comprising:
    a substrate having a first conductivity type or a second conductivity type and made of silicon carbide;
    a first impurity region having the first conductivity type, disposed on a front surface of the substrate, and having a lower impurity concentration than the substrate;
    a base region made of silicon carbide, having the second conductivity type, and disposed on the first impurity region;

a second impurity region made of silicon carbide, having the first conductivity type, disposed in a surface portion of the base region, and having a higher impurity concentration than the first impurity region;

a trench gate structure including a gate insulation film disposed on an inner wall of a trench, which is arranged from a surface of the second impurity region to a depth deeper than the base region and has one direction as a longitudinal direction, and a gate electrode disposed on the gate insulation film in the trench;

a first electrode electrically connected to the second impurity region and electrically connected to the base region;

a second electrode disposed on a rear surface of the substrate and electrically connected to the substrate;

a first current dispersion layer disposed between the first impurity region and the base region, made of silicon carbide, having the first conductivity type and a higher impurity concentration than the first impurity region;

a plurality of first deep layers made of silicon carbide, having the first conductivity type, disposed in the second current dispersion layer shallower than the first current dispersion layer, and extending in one direction as a longitudinal direction;

a second current dispersion layer, in which a bottom of the trench is located, disposed between the first current dispersion layer and the base region, made of silicon carbide, and having the first conductivity type; and a second deep layer made of silicon carbide, having the second conductivity type, disposed between the first current dispersion layer and the base region, connected to the base region and connected to the first deep layer, and spaced apart from the trench, wherein:

the plurality of first deep layers extend in a direction intersecting with the longitudinal direction of the trench; and the second deep layer extends in a direction intersecting with an extension direction of the first deep layers.

2. The silicon carbide semiconductor device according to claim 1, wherein:
adjacent two first deep layers among the plurality of first deep layers are connected to each other at a plurality of points.

3. The silicon carbide semiconductor device according to claim 1, wherein:
the second current dispersion layer has a higher impurity concentration than the first impurity region.

4. The silicon carbide semiconductor device according to claim 1, wherein:
an impurity concentration of the first current dispersion layer is defined as y [cm$^{-3}$];
a length of a narrowest portion between the adjacent two first deep layers is defined as x [μm]; and
the first current dispersion layer satisfies an equation of $y > 2 \times 10^{16}/x^{1.728}$.

5. The silicon carbide semiconductor device according to claim 1, wherein:
an impurity concentration of the first current dispersion layer is defined as y [cm$^{-3}$];
a length of a narrowest portion between the adjacent two first deep layers is defined as x [μm]; and
the first current dispersion layer satisfies an equation of $y < -2 \times 10^{17} x + 3 \times 10^{17}$.

6. The silicon carbide semiconductor device according to claim 1, further comprising:
a cell region in which the trench gate structure is disposed; and
an outer peripheral region surrounding the cell region, wherein:
the first current dispersion layer is disposed only in the cell region; and
a guard ring made of silicon carbide and having the second conductivity type is disposed in the outer peripheral region.

7. The silicon carbide semiconductor device according to claim 1, wherein:
a <11-20> direction is the longitudinal direction of the trench.

8. A method for manufacturing a silicon carbide semiconductor device having a trench gate structure, the method comprising:
providing a substrate having a first conductivity type or a second conductivity type and made of silicon carbide;
forming a first impurity region made of silicon carbide, having the first conductivity type with a lower impurity concentration than the substrate on a front surface of the substrate;
forming a first current dispersion layer having the first conductivity type, made of silicon carbide, and having a higher impurity concentration than the first impurity region on the first impurity region;
forming a plurality of first deep layers made of silicon carbide, having the second conductivity type shallower than the first current dispersion layer, and having one direction as a longitudinal direction in the first current dispersion layer by performing ion implantation and thermal treatment on the first current dispersion layer;
forming a second current dispersion layer made of silicon carbide and having the first conductivity type on the first current dispersion layer;
forming a second deep layer made of silicon carbide, having the second conductivity type, and connected to the first deep layer on the first current dispersion layer;
forming a base region made of silicon carbide, having the second conductivity type on both the second current dispersion layer and the second deep layer;
forming a second impurity region having the first conductivity type with a higher impurity concentration than the first impurity region in a surface portion of the base region;
forming a trench penetrating through the base region from the surface of the second impurity region, having a bottom located in the second current dispersion layer, separated from the second deep layer, and having one direction as a longitudinal direction;
forming a gate insulation film on an inner wall of the trench;
forming a gate electrode on the gate insulation film in the trench;
forming a first electrode electrically connected to both the second impurity region and the base region; and
forming a second electrode electrically connected to the substrate and disposed on a rear surface of the substrate, wherein:
the forming of the first current dispersion layer include:
forming the first current dispersion layer by performing ion implantation and thermal treatment on the first impurity region;
the forming of the plurality of first deep layers includes forming the plurality of first deep layers in a direction intersecting with the longitudinal direction of the trench, and the forming of the second deep layer includes forming the second deep layer in a direction intersecting with an extension direction of the first deep layer.

9. The method for manufacturing a silicon carbide semiconductor device according to claim 8, wherein:
the providing of the substrate includes providing the substrate for configuring a cell region and an outer peripheral region surrounding the cell region;
the forming of the first current dispersion layer includes forming the first current dispersion layer only in the cell region; and
the method further comprising:
forming a guard ring having the first conductivity type and surrounding the cell region in the outer peripheral region.

10. The method for manufacturing a silicon carbide semiconductor device according to claim 8, wherein:
the forming of the second current dispersion layer includes forming the second current dispersion layer by an epitaxial growth; and
the forming of the base region includes forming the base region by an epitaxial growth.

\* \* \* \* \*